United States Patent
Aoyama et al.

(10) Patent No.: US 10,446,397 B2
(45) Date of Patent: Oct. 15, 2019

(54) THERMAL PROCESSING METHOD THROUGH LIGHT IRRADIATION

(71) Applicant: SCREEN Holdings Co., Ltd., Kyoto (JP)

(72) Inventors: Takayuki Aoyama, Kyoto (JP); Hikaru Kawarazaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/297,213

(22) Filed: Oct. 19, 2016

(65) Prior Publication Data

US 2017/0117152 A1    Apr. 27, 2017

(30) Foreign Application Priority Data

Oct. 22, 2015    (JP) ................................ 2015-207661

(51) Int. Cl.
*H01L 21/225*    (2006.01)
*H01L 21/324*    (2006.01)
(Continued)

(52) U.S. Cl.
CPC ...... *H01L 21/2251* (2013.01); *H01L 21/2253* (2013.01); *H01L 21/2686* (2013.01);
(Continued)

(58) Field of Classification Search
None
See application file for complete search history.

(56) References Cited

U.S. PATENT DOCUMENTS 8,041,198 B2    10/2011    Kiyama et al. ............... 392/418
8,145,046 B2     3/2012    Kiyama et al. ............... 392/418
(Continued)

FOREIGN PATENT DOCUMENTS

JP    S56-146229 A    11/1981
JP    H11-31665 A     2/1999
(Continued)

OTHER PUBLICATIONS

Taiwan Office Action for Taiwan Application No. 105133108 dated Dec. 20, 2017 with English partial translation of the Taiwan Office Action based on the Japanese translation (attached).
(Continued)

*Primary Examiner* — Jay C Chang
(74) *Attorney, Agent, or Firm* — Ostrolenk Faber LLP

(57) ABSTRACT

When an insulated gate bipolar transistor is incorporated in a drive circuit of a flash lamp, so that a light emission pattern of the flash lamp is freely defined, a temperature change pattern of a surface of a semiconductor wafer that receives the emission of flash light can be adjusted. The length of diffusion of impurities can be controlled by rising a surface temperature of the semiconductor wafer from a preheating temperature to a diffusion temperature through emission of flash light and maintaining the surface temperature at the diffusion temperature for a time period not shorter than 1 millisecond and not longer than 10 milliseconds. Subsequently, the impurities can be activated by rising the surface temperature of the semiconductor wafer from the diffusion temperature to an activation temperature.

5 Claims, 13 Drawing Sheets

(51) Int. Cl.
  *H01L 21/67*      (2006.01)
  *H01L 21/268*     (2006.01)
  *H01L 29/16*      (2006.01)
  H01J 61/54        (2006.01)
  H05B 41/34        (2006.01)
  H01L 29/78        (2006.01)

(52) U.S. Cl.
  CPC ...... *H01L 21/324* (2013.01); *H01L 21/67115* (2013.01); *H01L 29/16* (2013.01); *H01J 61/547* (2013.01); H01L 29/7836 (2013.01); H05B 41/34 (2013.01)

(56) References Cited

U.S. PATENT DOCUMENTS

| | | | |
|---|---|---|---|
| 8,460,983 B1* | 6/2013 | Guo | C09D 183/16 438/164 |
| 8,859,443 B2 | 10/2014 | Yokouchi | 438/796 |
| 8,861,944 B2 | 10/2014 | Kiyama et al. | 392/407 |
| 2004/0018702 A1* | 1/2004 | Ito | H01L 21/2686 438/530 |
| 2005/0124123 A1 | 6/2005 | Itani et al. | |
| 2009/0197427 A1* | 8/2009 | Yoneda | H01L 21/2686 438/795 |
| 2009/0285568 A1 | 11/2009 | Kiyama et al. | 392/418 |
| 2011/0262115 A1 | 10/2011 | Yokouchi | |
| 2012/0238110 A1 | 9/2012 | Yokouchi | 438/795 |
| 2013/0043229 A1 | 2/2013 | Kiyama et al. | 219/200 |
| 2014/0254620 A1 | 9/2014 | Bessette et al. | |

FOREIGN PATENT DOCUMENTS

| | | |
|---|---|---|
| JP | 2005-142344 A | 6/2005 |
| JP | 2009-188209 A | 8/2009 |
| JP | 2009-260018 | 11/2009 |
| JP | 2009-277759 | 11/2009 |
| JP | 2011-082439 | 4/2011 |
| JP | 2011-086645 | 4/2011 |
| JP | 2011-119562 | 6/2011 |
| JP | 2011-159713 A | 8/2011 |
| JP | 2012-191095 | 10/2012 |
| JP | 2013-201453 | 10/2013 |
| JP | 2014-522576 A | 9/2014 |

OTHER PUBLICATIONS

Taiwanese Office Action dated Sep. 10, 2018 with English translation of the Office Action based on the Japanese translation (attached).
Taiwan Office Action for Taiwan Application No. 105133108 dated Dec. 22, 2018 with English partial translation of the Taiwan Office Action based on the Japanese translation (attached).
Notification of Reason(s) for Refusal dated Feb. 19, 2019 in counterpart Japanese Patent Application No. 2015-207661 with English translation.

* cited by examiner

F I G. 2
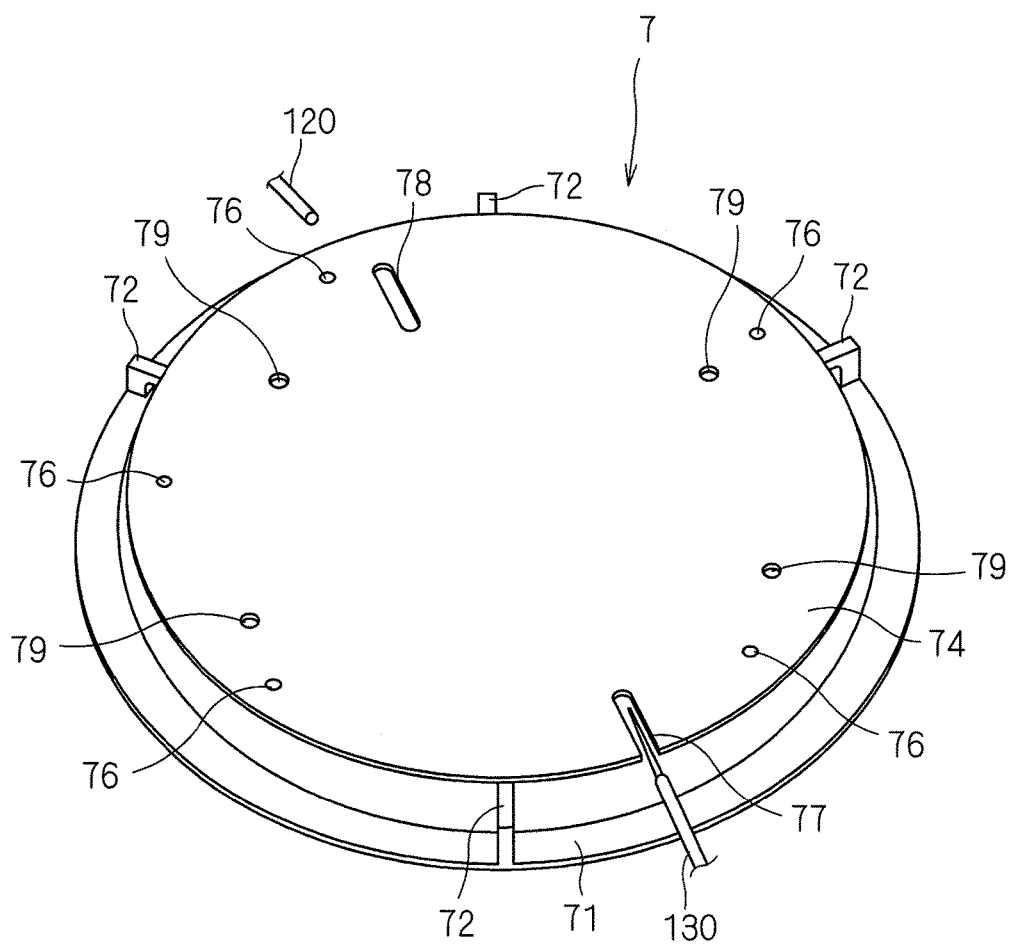

F I G. 4
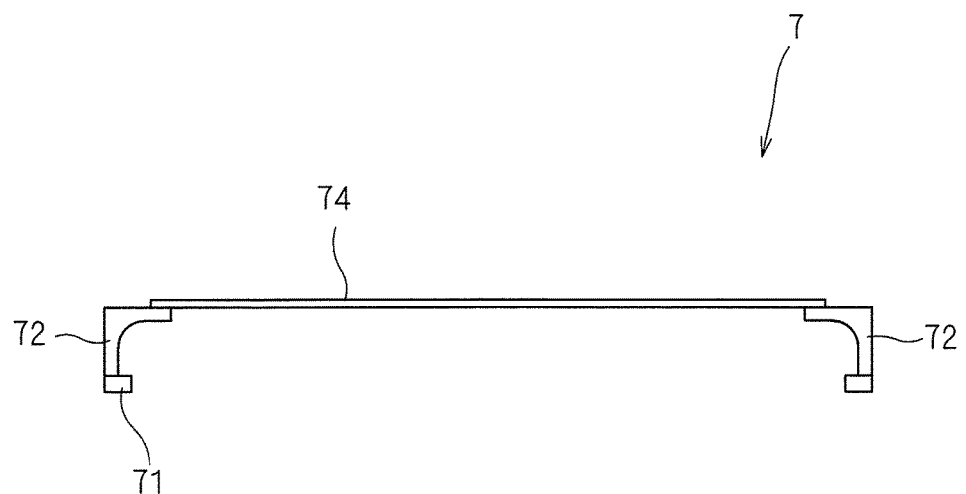

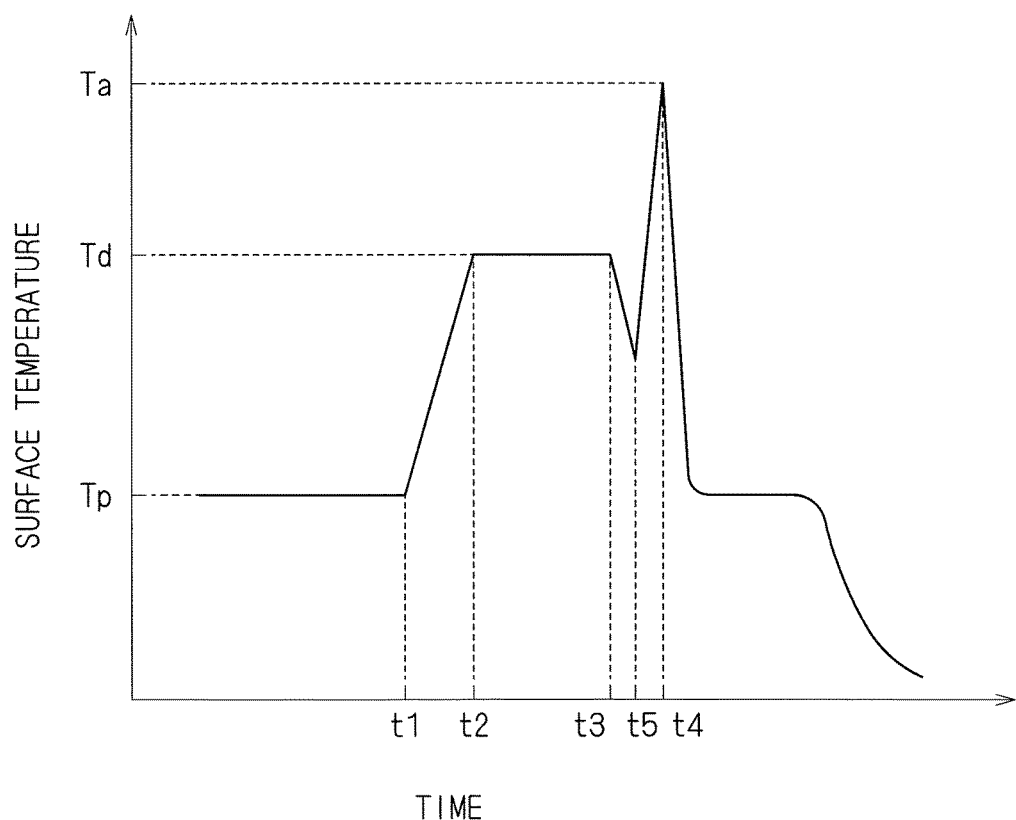
F I G . 1 1

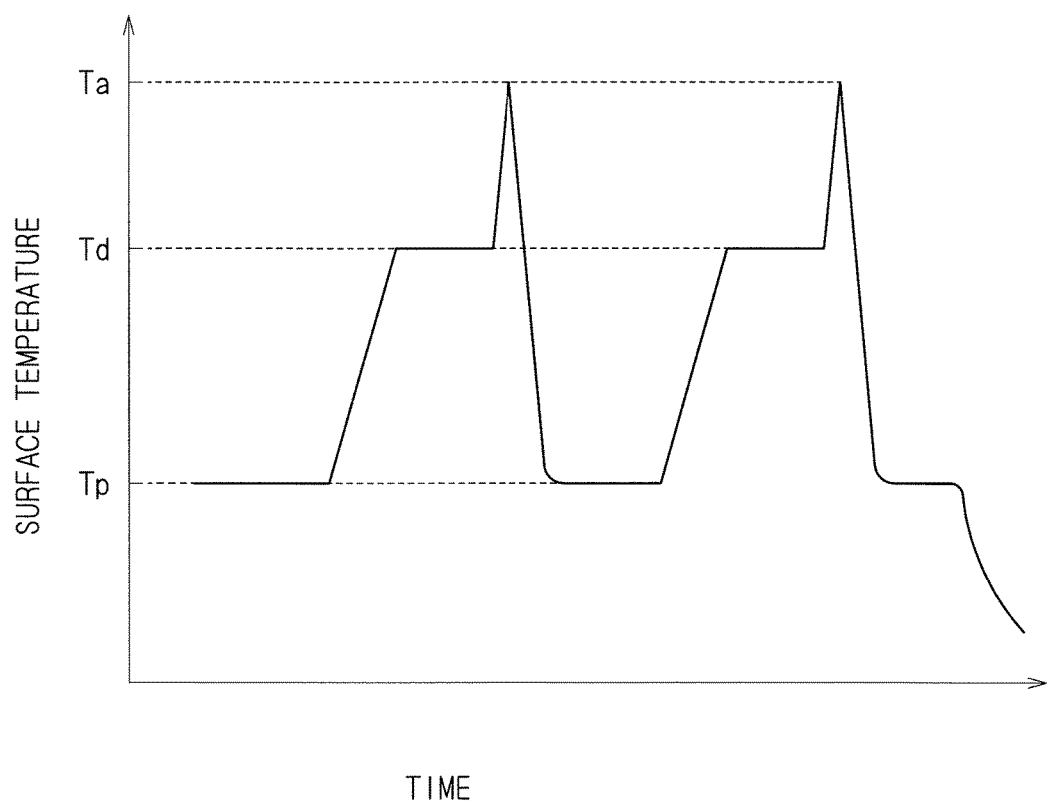
F I G . 1 2

THERMAL PROCESSING METHOD THROUGH LIGHT IRRADIATION

BACKGROUND OF THE INVENTION

Field of the Invention

The present invention relates to a thermal processing method of heating a thin-plate fine electronic substrate (hereinafter simply referred to as a "substrate") such as a semiconductor wafer to which impurities are introduced, by irradiating the substrate with light.

Description of the Background Art

In a process of manufacturing a semiconductor device, impurity introduction is a process necessary for forming a p-n junction in a semiconductor wafer. Currently, a typical impurity introduction is achieved by an ion implantation technique and a subsequent annealing technique. The ion implantation technique is a technology in which impurity elements such as boron (B), arsenic (As), and phosphorus (P) are ionized to collide onto a semiconductor wafer with a high acceleration voltage and physically perform impurity implantation. Implanted impurities are activated through anneal processing. In this process, an annealing time of several seconds or longer allows the implanted impurities to deeply diffuse by heat to have a junction depth much larger than required, potentially causing difficulties in favorable device formation.

For this reason, flash lamp annealing (FLA) has attracted attention recently as an anneal technology of heating a semiconductor wafer in an extremely short time. The flash lamp annealing is a thermal processing technology of rising temperature only at the surface of a semiconductor wafer in which impurities are implanted, in an extremely short time (several milliseconds or less) by irradiating the surface of the semiconductor wafer with flash light using a xenon flash lamp (hereinafter, a simple notation of "flash lamp" means the xenon flash lamp).

The xenon flash lamp has an emission spectral distribution ranging from ultraviolet to near-infrared, and has a wavelength shorter than that of the conventional halogen lamp, which is substantially the same as the fundamental absorption band of a silicon semiconductor wafer. Thus, when the semiconductor wafer is irradiated with flash light from the xenon flash lamp, less light is transmitted and thus the temperature of the semiconductor wafer can be rapidly risen. It has been found that the flash light irradiation in an extremely short time less than several milliseconds can selectively rise temperature only at the vicinity of the surface of the semiconductor wafer. Thus, when the xenon flash lamp is used to rise temperature in an extremely short time, only impurity activation can be executed without diffusing impurities deeply.

Japanese Patent Laid-Open No. 2013-201453 discloses that an insulated gate bipolar transistor (IGBT) is used to adjust the emission output waveform of a flash lamp by controlling current flowing through the flash lamp, and maintain the surface temperature of a semiconductor wafer at a target temperature for 10 milliseconds approximately. When the surface temperature of a semiconductor wafer is maintained at a target temperature for several milliseconds to several tens of milliseconds, repair of any defect introduced to the semiconductor wafer during impurity implantation can be performed in addition to the impurity activation.

The most useful technological characteristic provided by a flash lamp is an extremely short emission time, and thus the flash lamp annealing can execute only the impurity activation but not the impurities diffusion. Recently, the performance of a semiconductor device such as a CMOS has been required to be further enhanced by optimizing the overlapping length of source-drain extension under a gate, which requires appropriate control of the impurity diffusion. However, the conventional flash lamp annealing is basically intended to reduce the impurity diffusion to the extent possible, but cannot control the impurity diffusion.

SUMMARY OF THE INVENTION

The present invention is intended to provide a thermal processing method of heating a substrate in which impurities are introduced, by irradiating the substrate with light.

According to an aspect of the present invention, a thermal processing method includes the steps of: (a) irradiating a substrate with light to maintain, for a predetermined time, a surface temperature of the substrate at a diffusion temperature at which diffusion of impurities occurs; and (b) irradiating the substrate with light after the step (a) to rise the surface temperature of the substrate to an activation temperature at which activation of the impurities occurs.

The length of diffusion of the introduced impurities can be control, and the activation of the impurities and the diffusion control of the impurities can be both performed.

Preferably, the surface temperature of the substrate is decreased below the diffusion temperature between the step (a) and the step (b).

Heat accumulated on the substrate in the step (a) can be temporarily released, and the temperature of the substrate after the step (b) can be decreased fast.

Preferably, a cap film is formed on a region in which the impurities are introduced on a surface of the substrate.

Desorption of the impurities from the surface of the substrate in heating processing and decrease in the concentration of the impurities can be prevented.

Thus, it is an object of the present invention to perform both the activation of the impurities and the diffusion control of the impurities.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view illustrating the entire appearance of a holding unit.

FIG. 4 is a side view of the holding unit.

FIG. 11 is a diagram illustrating change in the surface temperature of a semiconductor wafer in a third preferred embodiment.

FIG. 12 is a diagram illustrating change in the surface temperature of a semiconductor wafer in a fourth preferred embodiment.

DESCRIPTION OF THE PREFERRED EMBODIMENTS

Preferred embodiments of the present invention will be described in detail below with reference to the accompanying drawings.

First Preferred Embodiment

Figure 1:
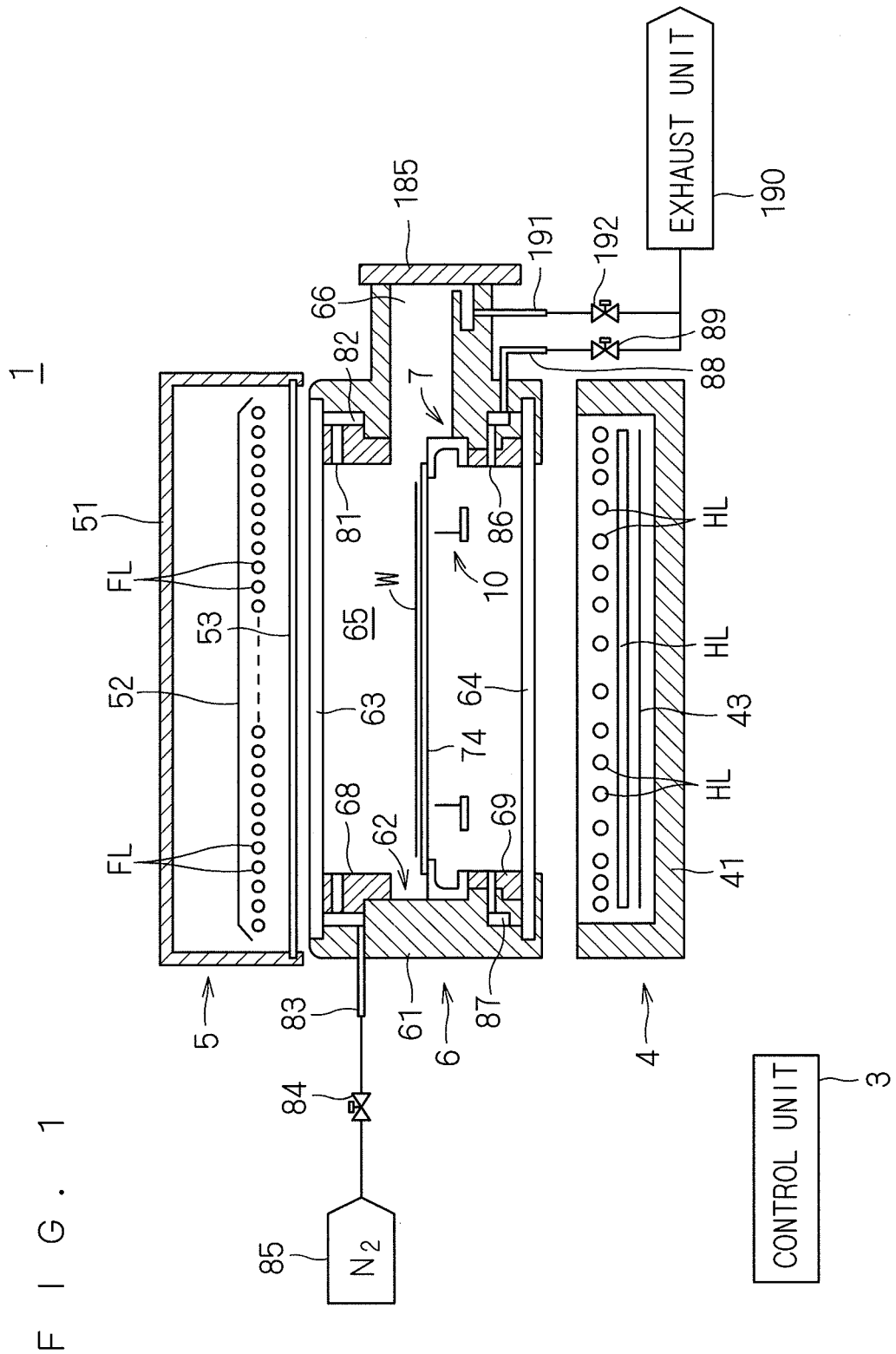
FIG. 1 is a vertical sectional view illustrating the configuration of a thermal processing apparatus according to the present invention.

FIG. 1 is a vertical sectional view illustrating the configuration of a thermal processing apparatus 1 according to the present invention. The thermal processing apparatus 1 according to the present preferred embodiment is a flash lamp annealing device configured to heat a semiconductor wafer W, as a substrate, in a circular disk shape by irradiating the semiconductor wafer W with flash light. The size of the semiconductor wafer W to be processed is not particularly limited, but is, for example, φ300 mm or φ450 mm. Impurities are introduced in the semiconductor wafer W before being transferred into the thermal processing apparatus 1, and activation processing of the introduced impurities and control of the amount of diffusion thereof are executed through heating processing by the thermal processing apparatus 1. In FIG. 1 and the following drawings, the dimension of each component and the number thereof are exaggerated or simplified as necessary to facilitate understanding.

The thermal processing apparatus 1 includes a chamber 6 configured to house the semiconductor wafer W, a flash heating unit 5 including a plurality of built-in flash lamps FL, and a halogen heating unit 4 including a plurality of built-in halogen lamps HL. The flash heating unit 5 is provided above the chamber 6, and the halogen heating unit 4 is provided below the chamber 6. The thermal processing apparatus 1 also includes, inside the chamber 6, a holding unit 7 configured to hold the semiconductor wafer W in a horizontal posture, and a transfer mechanism 10 configured to transfer the semiconductor wafer W between the holding unit 7 and the outside of the device. The thermal processing apparatus 1 also includes a control unit 3 configured to execute thermal processing of the semiconductor wafer W by controlling operation mechanisms provided to the halogen heating unit 4, the flash heating unit 5, and the chamber 6.

The chamber 6 is provided with a chamber window made of quartz mounted above and below a tubular chamber side part 61. The chamber side part 61 substantially has a tubular shape with openings at its upper and lower sides. The upper opening is closed by mounting an upper chamber window 63 thereon, and the lower opening is closed by mounting a lower chamber window 64 thereon. The upper chamber window 63 constituting the ceiling of the chamber 6 is a circular disk shape member made of quartz, and functions as a quartz window that transmits flash light emitted from the flash heating unit 5 into the chamber 6. The lower chamber window 64 constituting the floor of the chamber 6 is a circular disk shape member made of quartz, and functions as a quartz window that transmits light from the halogen heating unit 4 into the chamber 6.

A reflection ring 68 is mounted at an upper part of an inner wall surface of the chamber side part 61, and a reflection ring 69 is mounted at a lower part thereof. The reflection rings 68 and 69 are each formed in a circular ring. The upper reflection ring 68 is mounted by being inset from above the chamber side part 61. The lower reflection ring 69 is mounted by being inset from below the chamber side part 61 and fastened by a screw (not illustrated). In other words, the reflection rings 68 and 69 are detachably mounted on the chamber side part 61. A thermal processing space 65 is defined to be an inner space of the chamber 6, which is a space enclosed by the upper chamber window 63, the lower chamber window 64, the chamber side part 61, and the reflection rings 68 and 69.

When the reflection rings 68 and 69 are mounted on the chamber side part 61, a recess 62 is formed on an inner wall surface of the chamber 6. In other words, the recess 62 is formed, the recess 62 being enclosed by a central part of the inner wall surface of the chamber side part 61, where the reflection rings 68 and 69 are not mounted, a lower end surface of the reflection ring 68, and an upper end surface of the reflection ring 69. The recess 62 is formed in a circular ring on the inner wall surface of the chamber 6 along the horizontal direction, surrounding the holding unit 7 that holds the semiconductor wafer W.

The chamber side part 61 and the reflection rings 68 and 69 are made of a metal material (for example, stainless steel) that is excellent in strength and thermal resistance. The inner peripheral surfaces of the reflection rings 68 and 69 are mirrored by electrolytic nickel plating.

The chamber side part 61 is provided with a transfer opening (furnace entrance) 66 through which the semiconductor wafer W is transferred into and from the chamber 6. The transfer opening 66 can be opened and closed through a gate valve 185. The transfer opening 66 is communicated with the outer peripheral surface of the recess 62. With this configuration, when the transfer opening 66 is opened by the gate valve 185, the semiconductor wafer W can be transferred to and from the thermal processing space 65 through the transfer opening 66 and the recess 62. When the transfer opening 66 is closed by the gate valve 185, the thermal processing space 65 in the chamber 6 is sealed.

A gas supply hole 81 for supplying processing gas (nitrogen gas ($N_2$) in the present preferred embodiment) to the thermal processing space 65 is provided at an upper part of the inner wall of the chamber 6. The gas supply hole 81 is provided higher than the recess 62, and may be provided to the reflection ring 68. The gas supply hole 81 is communicated with a gas supply pipe 83 through a buffer space 82 formed in a circular ring on the inner sidewall of the chamber 6. The gas supply pipe 83 is connected with a nitrogen gas supply source 85. A valve 84 is inserted on the path of the gas supply pipe 83. When the valve 84 is opened, nitrogen gas is supplied from the nitrogen gas supply source 85 to the buffer space 82. Nitrogen gas flowing into the buffer space 82 spreads inside the buffer space 82 having a smaller fluid resistance than that of the gas supply hole 81 and is supplied to the thermal processing space 65 through the gas supply hole 81. The processing gas is not limited to nitrogen gas, but may be inert gas such as argon (Ar) or helium (He), or reactive gas such as oxygen ($O_2$), hydrogen ($H_2$), chlorine ($Cl_2$), hydrogen chloride (HCl), ozone ($O_3$), or ammonia ($NH_3$).

A gas exhaust hole 86 for exhausting gas in the thermal processing space 65 is provided at a lower part of the inner wall of the chamber 6. The gas exhaust hole 86 is provided lower than the recess 62, and may be provided to the reflection ring 69. The gas exhaust hole 86 is communicated with a gas exhaust pipe 88 through a buffer space 87 formed in a circular ring on the inner sidewall of the chamber 6. The gas exhaust pipe 88 is connected with an exhaust unit 190. A valve 89 is inserted on the path of the gas exhaust pipe 88. When the valve 89 is opened, gas in the thermal processing space 65 is exhausted to the gas exhaust pipe 88 through the gas exhaust hole 86 and the buffer space 87. A plurality of the gas supply holes 81 and the gas exhaust holes 86 may be provided along the circumferential direction of the chamber 6, and may be shaped in slits. The nitrogen gas supply source 85 and the exhaust unit 190 may be mechanisms provided to the thermal processing device 1 or may be utilities of a factory at which the thermal processing device 1 is installed.

Another gas exhaust pipe 191 for exhausting gas in the thermal processing space 65 is connected with a leading end of the transfer opening 66. The gas exhaust pipe 191 is connected with the exhaust unit 190 through a valve 192. When the valve 192 is opened, gas in the chamber 6 is exhausted through the transfer opening 66.

Figure 3:
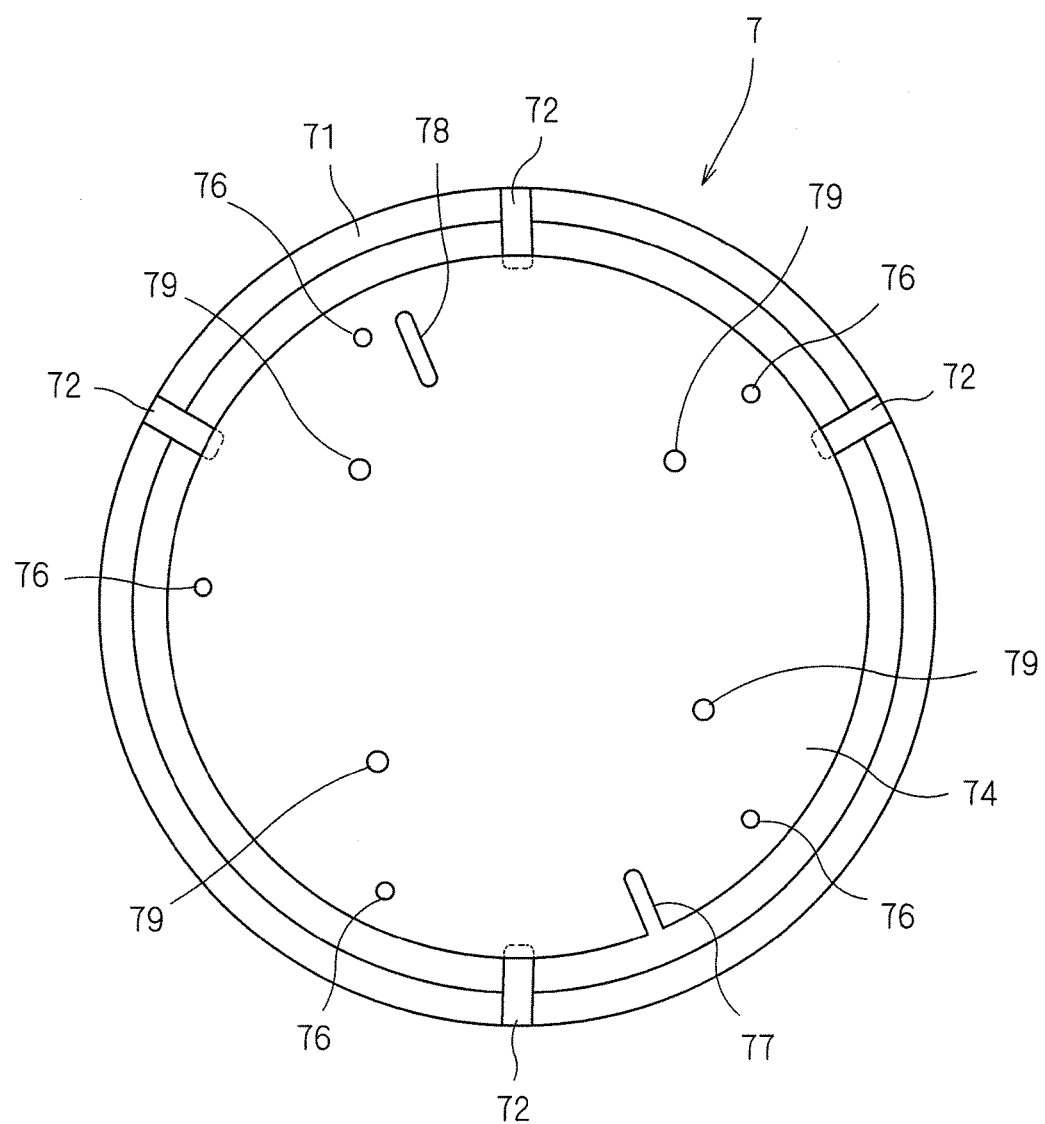
FIG. 3 is a plan view of the holding unit viewed from top.

FIG. 2 is a perspective view illustrating the entire appearance of the holding unit 7. FIG. 3 is a plan view of the holding unit 7 viewed from top, and FIG. 4 is a side view of the holding unit 7. The holding unit 7 includes a base ring 71, a coupling member 72, and a susceptor 74. The base ring 71, the coupling member 72, and the susceptor 74 are made of quartz. In other words, the entire holding unit 7 is made of quartz.

The base ring 71 is a quartz member having a circular ring shape. The base ring 71 is supported on the wall surface of the chamber 6 when placed on the bottom surface of the recess 62 (refer to FIG. 1). A plurality (in the present preferred embodiment, four) of the coupling members 72 are erected on the upper surface of the circular-ring base ring 71 along the circumferential direction thereof. The coupling member 72 is made of quartz and adhered to the base ring 71 by welding. The shape of the base ring 71 may be an arc, which is a circular ring with part thereof being lacked.

The flat plate susceptor 74 is supported by the four coupling members 72 provided to the base ring 71. The susceptor 74 is a flat plate member made of quartz and substantially having a circular shape. The susceptor 74 has a diameter larger than the diameter of the semiconductor wafer W. In other words, the susceptor 74 has a plane size larger than that of the semiconductor wafer W. A plurality (in the present preferred embodiment, five) of guide pins 76 are erected on the upper surface of the susceptor 74. The five guide pins 76 are provided on the periphery of a concentric circle of the outer peripheral circle of the susceptor 74. The circle on which the five guide pins 76 are arranged has a diameter slightly larger than the diameter of the semiconductor wafer W. Each guide pin 76 is also made of quartz. The guide pin 76 may be fabricated from quartz ingot integrally with the susceptor 74, or may be fabricated separately from the susceptor 74 and attached to the susceptor 74 by, for example, welding.

The four coupling members 72 erected on the base ring 71 are adhered to the lower surface of a peripheral part of the susceptor 74 by welding. In other words, the susceptor 74 and the base ring 71 are fixedly coupled with each other through the coupling members 72, and the holding unit 7 is an integrally formed quartz member. The base ring 71 of the holding unit 7 is supported on the wall surface of the chamber 6, and the holding unit 7 is mounted on the chamber 6. When the holding unit 7 is mounted on the chamber 6, the susceptor 74 substantially having a circular disk shape is in a horizontal posture (in which the normal thereof is aligned with the vertical direction). The semiconductor wafer W transferred into the chamber 6 is placed and held in a horizontal posture on the susceptor 74 of the holding unit 7 mounted on the chamber 6. The semiconductor wafer W is placed inside a circle formed by the five guide pins 76 to prevent any positional shift in the horizontal direction. The number of the guide pins 76 is not limited to five, but may be any number enough to prevent the positional shift of the semiconductor wafer W.

As illustrated in FIGS. 2 and 3, an opening 78 and a cutout 77 vertically penetrating are formed in the susceptor 74. The cutout 77 is a cutout provided through which a probe leading end part of a contact thermometer 130 using a thermocouple is placed. The opening 78 is provided to allow a radiation thermometer 120 to receive radiation light (infrared light) emitted from the lower surface of the semiconductor wafer W held by the susceptor 74. In addition, four through-holes 79 through which a lift pin 12 of the transfer mechanism 10 to be described later is penetrated for transferring of the semiconductor wafer W are drilled in the susceptor 74.

Figure 5:
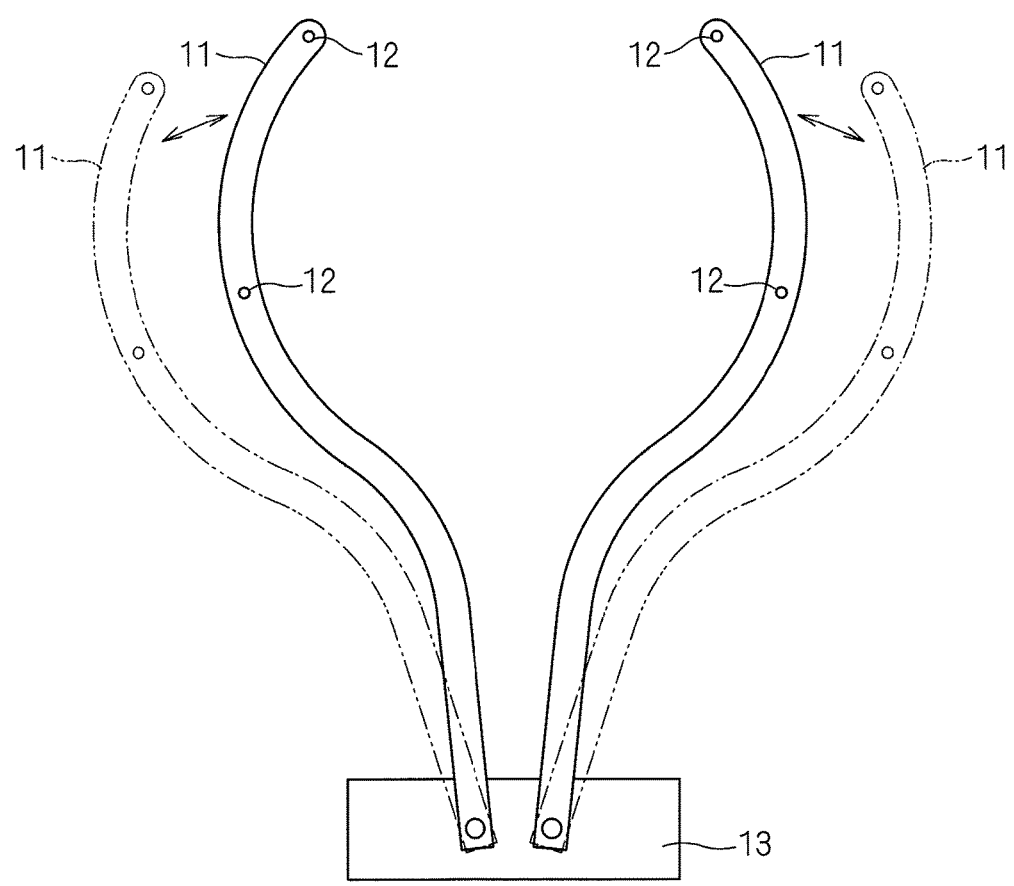
FIG. 5 is a plan view of a transfer mechanism.
Figure 6:
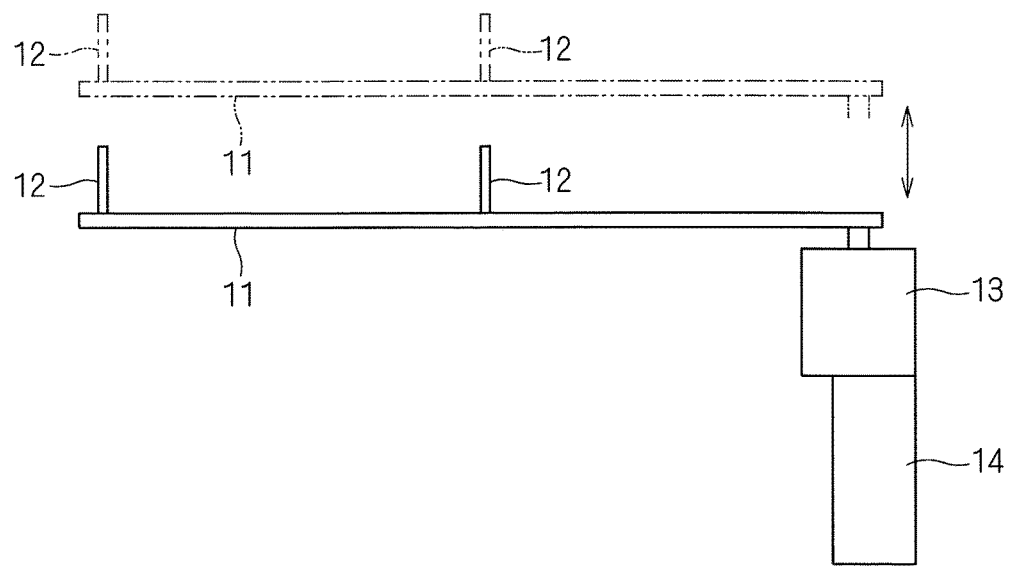
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 each have an arc shape along the substantially circular ring shape of the recess 62. The two lift pins 12 are erected on each transfer arm 11. Each transfer arm 11 can be rotated by a horizontal movement mechanism 13. The horizontal movement mechanism 13 allows the pair of transfer arms 11 to horizontally move between a transfer operation position (position illustrated by a solid line in FIG. 5) at which the horizontal movement mechanism 13 performs transfer of the semiconductor wafer W onto the holding unit 7, and a retracted position (position illustrated by a dashed and double-dotted line in FIG. 5) at which the horizontal movement mechanism 13 does not overlap with the semiconductor wafer W held by the holding unit 7 in plan view. The horizontal movement mechanism 13 may be configured to rotate individually the transfer arms 11 through individual motors, or may be configured to rotate the pair of transfer arms 11 in an cooperative manner through one motor using a link mechanism.

The pair of transfer arms 11 are moved up and down together with the horizontal movement mechanism 13 by an elevation mechanism 14. When the elevation mechanism 14 moves up the pair of transfer arms 11 at the transfer operation position, a total of four of the lift pins 12 passes through the through-holes 79 (refer to FIGS. 2 and 3) drilled in the susceptor 74, so that the upper ends of the lift pins 12 stick out of the upper surface of the susceptor 74. When the elevation mechanism 14 moves down the pair of transfer arms 11 at the transfer operation position to remove the lift pins 12 from the through-holes 79, and the horizontal movement mechanism 13 moves the pair of transfer arms 11 to open, the transfer arms 11 are moved to the retracted position. The retracted position of the pair of transfer arms 11 is located directly above the base ring 71 of the holding unit 7. Since the base ring 71 is placed on the bottom surface of the recess 62, the retracted position of the transfer arms 11 is located inside the recess 62. An exhaust mechanism (not illustrated) is provided near positions at which the driving units (the horizontal movement mechanism 13 and the elevation mechanism 14) of the transfer mechanism 10 are provided, so as to exhaust atmosphere around the driving units of the transfer mechanism 10 out of the chamber 6.

As illustrated in FIG. 1, the flash heating unit 5 provided above the chamber 6 includes, inside a housing 51, a light source including a plurality (in the present preferred embodiment, thirty) of the xenon flash lamps FL, and a reflector 52 provided to cover above the light source. A lamp light emission window 53 is mounted on a bottom part of the housing 51 of the flash heating unit 5. The lamp light emission window 53 constituting the floor of the flash heating unit 5 is a plate quartz window made of quartz. Since the flash heating unit 5 is installed above the chamber 6, the lamp light emission window 53 and the upper chamber window 63 face to each other. The flash lamps FL irradiate the thermal processing space 65 with flash light from above the chamber 6 through the lamp light emission window 53 and the upper chamber window 63.

The plurality of flash lamps FL are each a bar lamp having a long cylinder shape and are arrayed in a plane such that the longitudinal directions of the flash lamps FL are parallel to each other along a main surface of the semiconductor wafer W held by the holding unit 7 (along the horizontal direction). The plane of the array of the flash lamps FL is a horizontal plane.

Figure 8:
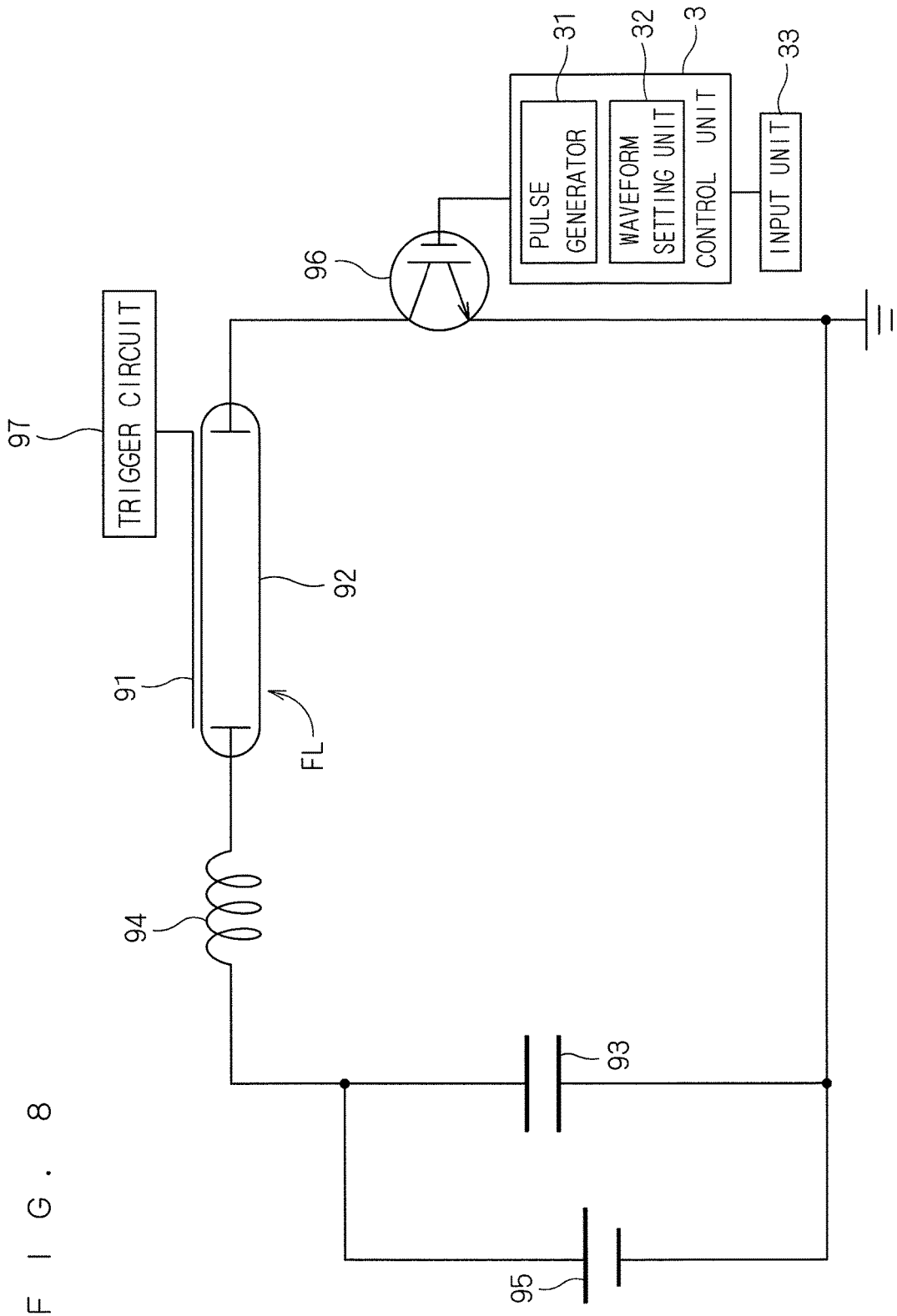
FIG. 8 is a diagram illustrating a drive circuit of a flash lamp.

FIG. 8 is a diagram illustrating a drive circuit of each flash lamp FL. As illustrated in FIG. 8, a capacitor 93, a coil 94, the flash lamp FL, and an IGBT (insulated gate bipolar transistor) 96 are connected with each other in series. As illustrated in FIG. 8, the control unit 3 includes a pulse generator 31 and a waveform setting unit 32, and is connected with an input unit 33. The input unit 33 may be various kinds of well-known input instruments such as a keyboard, a mouse, and a touch panel. The waveform setting unit 32 sets the waveform of a pulse signal based on the content of input from the input unit 33, and then the pulse generator 31 generates a pulse signal in accordance with the waveform.

The flash lamp FL includes a glass tube (discharge tube) 92 in which xenon gas is encapsulated and at both end parts of which an anode and a cathode are arranged, and a trigger electrode 91 additionally provided on the outer peripheral surface of the glass tube 92. The capacitor 93 receives predetermined voltage applied by a power unit 95, and stores therein electric charge in accordance with the applied voltage (charge voltage). The trigger electrode 91 can receive high voltage applied from a trigger circuit 97. A timing at which the trigger circuit 97 applies voltage to the trigger electrode 91 is controlled by the control unit 3.

The IGBT 96 is a bipolar transistor in which a metal oxide semiconductor field effect transistor (MOSFET) is incorporated in a gate, and is a switching element suitable for treating a large amount of electrical power. The gate of the IGBT 96 receives a pulse signal applied from the pulse generator 31 of the control unit 3. The IGBT 96 becomes an ON state when a voltage (High voltage) equal to or higher than a predetermined value is applied to the gate of the IGBT 96, and the IGBT 96 becomes an off state when a voltage (Low voltage) lower than the predetermined value is applied to the gate of the IGBT 96. In this manner, the drive circuit including the flash lamp FL is turned on and off through the IGBT 96. Connection between the flash lamp FL and the corresponding capacitor 93 is turned on and off by turning on and off the IGBT 96, thereby controlling turning on and off of current flowing through the flash lamp FL. The IGBT 96 is turned on and off in 0.1 millisecond or less (for example, 50 microseconds), and thus a control accuracy of a thermal processing time is 0.1 millisecond or less, which is highly accurate.

When the IGBT 96 is turned on while the capacitor 93 is charged, and high voltage is applied to the end-part electrodes of the glass tube 92, no electricity flows in the glass tube 92 in a normal state since xenon gas is electrically an insulator. However, when the trigger circuit 97 applies high voltage to the trigger electrode 91 to break the insulation, current instantaneously flows in the glass tube 92 through discharge between the end-part electrodes, and light is released through excitation of xenon atom or molecule.

The drive circuit as illustrated in FIG. 8 is individually provided to each of the plurality of flash lamps FL provided to the flash heating unit 5. In the present preferred embodiment, the thirty flash lamps FL are arrayed in a plane, and thus the thirty corresponding drive circuits as illustrated in FIG. 8 are provided. With this configuration, current flowing through each of the thirty flash lamps FL is individually turned on and off by the corresponding IGBT 96.

The reflector 52 is provided above the plurality of flash lamps FL, covering the entire flash lamps FL. A basic function of the reflector 52 is to reflect, toward the thermal processing space 65, flash light emitted from the plurality of flash lamps FL. The reflector 52 is formed as an aluminum alloy plate, and has a surface (facing to the flash lamps FL) provided with roughing fabrication by blast processing.

The halogen heating unit 4 provided below the chamber 6 includes a plurality (in the present preferred embodiment, forty) of the built-in halogen lamps HL inside a housing 41. The halogen heating unit 4 is a light irradiator configured to heat the semiconductor wafer W by irradiating the thermal processing space 65 with light from below the chamber 6 through the lower chamber window 64 by using the plurality of halogen lamps HL.

Figure 7:
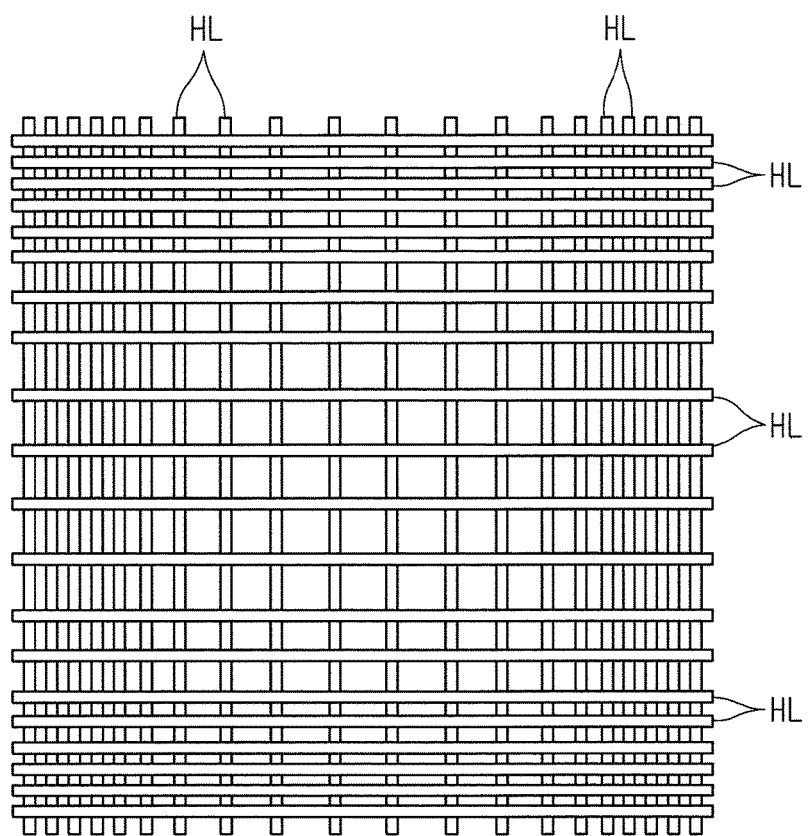
FIG. 7 is a plan view illustrating arrangement of a plurality of halogen lamps.

FIG. 7 is a plan view illustrating arrangement of the plurality of halogen lamps HL. The forty halogen lamps HL are arranged separately in upper and lower parts. The twenty halogen lamps HL are arranged in the upper part closer to the holding unit 7, and the twenty halogen lamps HL are arranged in the lower part farther from the holding unit 7 than the upper part. Each halogen lamp HL is a bar lamp having a long cylinder shape. In each of the upper part and the lower part, the twenty halogen lamps HL are arrayed such that the longitudinal directions of the halogen lamps HL are parallel to each other along the main surface of the semiconductor wafer W held by the holding unit 7 (along the horizontal direction). In the upper and lower parts, the plane of the array of the halogen lamps HL is a horizontal plane.

As illustrated in FIG. 7, in the upper and lower parts, the halogen lamps HL have a higher arrange density in a region opposite to a peripheral part of the semiconductor wafer W held by the holding unit 7 than in a region opposite to a central part of the semiconductor wafer W. In other words, in the upper and lower parts, the halogen lamps HL have a shorter arrange pitch in the peripheral part of the lamp array than in the central part thereof. With this configuration, irradiation with a larger light quantity can be performed in the peripheral part of the semiconductor wafer W, in which temperature fall is likely to occur at heating through irradiation with light from the halogen heating unit 4.

A lamp group of the halogen lamps HL in the upper part and a lamp group of the halogen lamps HL in the lower part are arrayed so as to intersect with each other in a lattice. In other words, a total of forty of the halogen lamps HL are arranged such that the longitudinal directions of the twenty halogen lamps HL arranged in the upper part and the longitudinal directions of the twenty halogen lamps HL arranged in the lower part are orthogonal to each other.

Each halogen lamp HL is a filament-type light source that energizes a filament arranged inside the glass tube to make the filament in candescent and causes light emission. The glass tube encapsulates inert gas such as nitrogen or argon introduced with a small amount of halogen element (iodine or bromine, for example). The introduction of halogen element allows the temperature of the filament to be set to a high temperature while reducing damage on the filament. Thus, the halogen lamp HL has a long life and is capable of continuously emitting light with a high intensity as compared to a normal filament lamp. In other words, the halogen lamp HL is a continuously lighting lamp configured to emit light continuously for at least one second or longer. Since the halogen lamp HL is a bar lamp, the halogen lamp HL has a long life, and the halogen lamp HL achieves an excellent efficiency of emission to the semiconductor wafer W held above the halogen lamp HL, when arranged in the horizontal direction.

A reflector 43 is provided in the housing 41 of the halogen heating unit 4 below the two stages of the halogen lamps HL (FIG. 1). The reflector 43 reflects light emitted from the plurality of halogen lamps HL toward the thermal processing space 65.

The control unit 3 controls the above-described various kinds of operation mechanisms provided to the thermal processing apparatus 1. The control unit 3 has a hardware configuration same as that of a typical computer. In other words, the control unit 3 includes a CPU that is a circuit configured to perform various kinds of arithmetic processing, a ROM as a read-only memory configured to store therein a basic computer program, a RAM as a writable memory configured to store therein various kinds of information, and a magnetic disk configured to store therein control software and data. Processing in the thermal processing apparatus 1 is proceeded by the CPU of the control unit 3 executing a predetermined processing program. As illustrated in FIG. 8, the control unit 3 includes the pulse generator 31 and the waveform setting unit 32. As described above, the waveform setting unit 32 sets the waveform of a pulse signal based on the content of input from the input unit 33, and then the pulse generator 31 outputs a pulse signal to the gate of the IGBT 96 in accordance with the waveform.

The thermal processing apparatus 1 includes, in addition to the above-described configuration, various cooling structures to prevent excessive rise in the temperature of the halogen heating unit 4, the flash heating unit 5, and the chamber 6 due to thermal energy generated from the halogen lamps HL and the flash lamps FL at the thermal processing of the semiconductor wafer W. For example, a water-cooling tube (not illustrated) is provided to the wall of the chamber 6. The halogen heating unit 4 and the flash heating unit 5 have air cooling structures in which gas flow is generated to release heat. Air is supplied to a gap between the upper chamber window 63 and the lamp light emission window 53 so as to cool the flash heating unit 5 and the upper chamber window 63.

Figure 9:
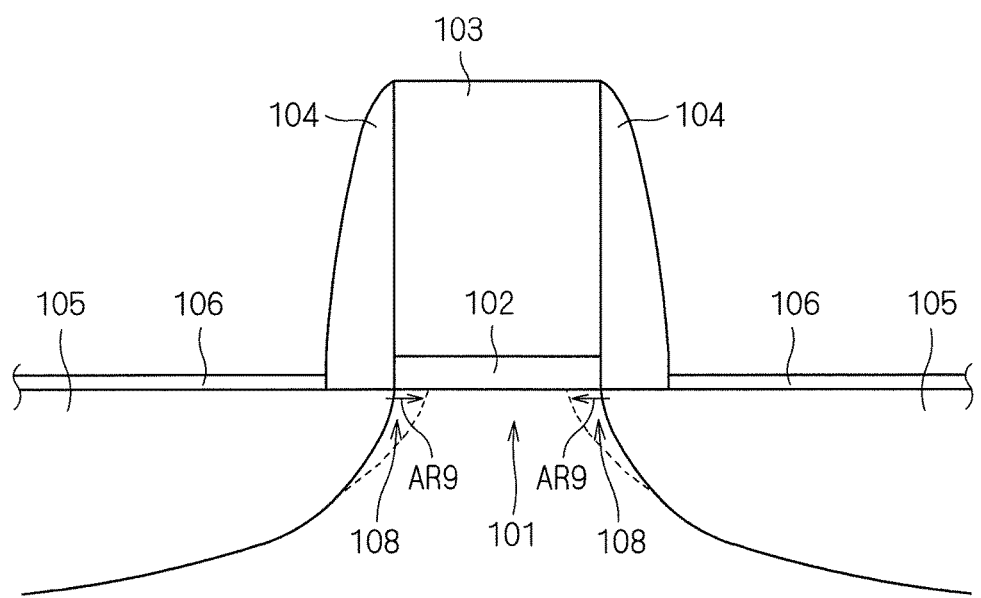
FIG. 9 is a diagram illustrating a device structure formed on a semiconductor wafer to be processed in the thermal processing apparatus in FIG. 1.

The following describes a procedure of processing the semiconductor wafer W in the thermal processing apparatus 1. The semiconductor wafer W to be processed is a semiconductor substrate to which impurities (ions) are added by the ion implantation technique. FIG. 9 is a diagram illustrating a device structure formed on the semiconductor wafer W to be processed in the thermal processing apparatus 1. A gate insulating film 102 is formed on a silicon (Si) substrate 101 of the semiconductor wafer W. Typically, the gate insulating film 102 is a silicon dioxide film ($SiO_2$). A gate electrode 103 is formed on the gate insulating film 102.

Metal or polysilicon is used for the gate electrode 103. SiN sidewalls 104 are formed on both sides of the gate electrode 103. The gate insulating film 102 may be a high-dielectric-constant film (high-k film) made of, for example, $HfO_2$.

Source-drain regions 105 are formed on both sides of the gate electrode 103 in the upper surface of the silicon substrate 101. Each source-drain region 105 includes ions implanted by an ion implantation device. A SiN cap film 106 is formed on the surface of the source-drain region 105 in which impurities are implanted. The cap film 106 is formed as an accumulation having a film thickness of 5 nm approximately by, for example, atomic layer deposition (ALD).

Extension regions 108 protruding from the source-drain regions 105 toward a region below the gate electrode 103 are formed in the upper surface of the silicon substrate 101. In each extension region 108, when anneal processing to be described later is performed, the impurities introduced to the source-drain regions 105 are diffused toward the region below the gate electrode 103 as illustrated by arrow AR9 in FIG. 9. The length of overlapping of a part in which the impurities are diffused with a region below the gate electrode 103 is an important parameter that determines the performance of a semiconductor device.

The thermal processing apparatus 1 performs the thermal processing on the semiconductor wafer W having the structure as illustrated in FIG. 9. The following describes an operation procedure at the thermal processing apparatus 1. The operation procedure at the thermal processing apparatus 1 is proceeded by the control unit 3 controlling the operation mechanisms of the thermal processing apparatus 1.

When the valve 84 is opened for air supply and the valves 89 and 192 are opened for air exhaust, air supplying and discharging to and from the chamber 6 is started. When the valve 84 is opened, nitrogen gas is supplied into the thermal processing space 65 through the gas supply hole 81. When the valve 89 is opened, gas in the chamber 6 is exhausted through the gas exhaust hole 86. With this configuration, nitrogen gas supplied from an upper part of the thermal processing space 65 in the chamber 6 flows downward and is exhausted from a lower part of the thermal processing space 65.

When the valve 192 is opened, gas in the chamber 6 is exhausted through the transfer opening 66. In addition, atmosphere around the driving units of the transfer mechanism 10 is exhausted by the exhaust mechanism (not illustrated). At the thermal processing of the semiconductor wafer W in the thermal processing apparatus 1, nitrogen gas is continuously supplied into the thermal processing space 65, and the amount of the supply is changed as appropriate in accordance with a processing process.

Subsequently, the gate valve 185 is opened to open the transfer opening 66, the semiconductor wafer W having the structure illustrated in FIG. 9 is transferred into the thermal processing space 65 in the chamber 6 through the transfer opening 66 by a transfer robot outside of the apparatus. The semiconductor wafer W transferred in by the transfer robot is moved to a position directly above the holding unit 7 and stops there. Then, the pair of transfer arms 11 of the transfer mechanism 10 horizontally move from the retracted position to the transfer operation position and rise, so that the lift pins 12 stick out of the upper surface of the susceptor 74 through the through-holes 79 so as to receive the semiconductor wafer W.

After the semiconductor wafer W is placed on the lift pins 12, the transfer robot leaves the thermal processing space 65, and the transfer opening 66 is closed through the gate valve 185. Then, the pair of transfer arms 11 are moved down to pass the semiconductor wafer W from the transfer mechanism 10 onto the susceptor 74 of the holding unit 7, so that the semiconductor wafer W is held from below in a horizontal posture. The semiconductor wafer W is held by the holding unit 7 with the front surface on which the gate electrode 103 and the like are formed being held upward. The semiconductor wafer W is held inside the five guide pins 76 on the upper surface of the susceptor 74. When moved down to below the susceptor 74, the pair of transfer arms 11 is retracted to the retracted position, in other words, the inside of the recess 62 by the horizontal movement mechanism 13.

When the semiconductor wafer W is held from below in a horizontal posture by the holding unit 7 made of quartz, all of the forty halogen lamps HL of the halogen heating unit 4 are turned on to start preheating (assist heating). Halogen light emitted from the halogen lamps HL transmits through the lower chamber window 64 and the susceptor 74 made of quartz and irradiates the back surface (main surface opposite to the front surface) of the semiconductor wafer W. The semiconductor wafer W is preheated by receiving the light irradiation from the halogen lamps HL, and the temperature of the semiconductor wafer W rises. When retracted inside the recess 62, the transfer arms 11 of the transfer mechanism 10 do not interfere the heating by the halogen lamps HL.

When the preheating by the halogen lamps HL is performed, the temperature of the semiconductor wafer W is measured by the contact thermometer 130. Specifically, the contact thermometer 130 including a built-in thermocouple contacts with the lower surface of the semiconductor wafer W held by the holding unit 7, through the cutout 77 of the susceptor 74 to measure the rising wafer temperature. The measured temperature of the semiconductor wafer W is transmitted to the control unit 3. The control unit 3 controls output of the halogen lamps HL while monitoring whether the temperature of the semiconductor wafer W, which is risen through the light irradiation from the halogen lamps HL, reaches a predetermined preheating temperature Tp. In other words, the control unit 3 performs feedback control of the output of the halogen lamps HL based on a value measured by the contact thermometer 130 so that the temperature of the semiconductor wafer W becomes equal to the preheating temperature Tp. The preheating temperature Tp is 200° C. to 800° C. approximately, and preferably 350° C. to 600° C. approximately, at which diffusion of the impurities added to the semiconductor wafer W by heat is unlikely to occur (in the present preferred embodiment, 600° C.). When the temperature of the semiconductor wafer W is risen through the light irradiation from the halogen lamps HL, the temperature measurement by the radiation thermometer 120 is not performed. This is because halogen light emitted from the halogen lamps HL is incident on the radiation thermometer 120 as disturbance light, disabling accurate temperature measurement.

After the temperature of the semiconductor wafer W has reached the preheating temperature Tp, the control unit 3 temporarily maintains the semiconductor wafer W at the preheating temperature Tp. Specifically, when the temperature of the semiconductor wafer W measured by the contact thermometer 130 reaches the preheating temperature Tp, the control unit 3 adjusts the output of the halogen lamps HL to maintain the temperature of the semiconductor wafer W substantially at the preheating temperature Tp.

The temperature of the entire semiconductor wafer W is uniformly risen to the preheating temperature Tp through the preheating by the halogen lamps HL. At the preheating by the halogen lamps HL, the temperature of the peripheral part of the semiconductor wafer W, from which heat is more likely to be released, tends to fall below the temperature of the central part of the semiconductor wafer W. However, the arrange density of the halogen lamps HL in the halogen heating unit 4 is higher in the region opposite to the peripheral part of the semiconductor wafer W than in the region opposite to the central part of the semiconductor wafer W. With this configuration, a larger amount of light is incident on the peripheral part of the semiconductor wafer W, from which heat is likely to be released, thereby achieving a uniform in-plane temperature distribution of the semiconductor wafer W at the preheating. In addition, since the inner peripheral surface of the reflection ring 69 mounted on the chamber side part 61 is mirrored, a larger amount of light is reflected toward the peripheral part of the semiconductor wafer W by the inner peripheral surface of the reflection ring 69, thereby further achieving a uniform in-plane temperature distribution of the semiconductor wafer W at the preheating.

When a predetermined time has elapsed after the temperature of the semiconductor wafer W reached the preheating temperature Tp, the flash lamps FL of the flash heating unit 5 irradiate the front surface of the semiconductor wafer W with flash light. Electric charge is previously accumulated on the capacitor 93 by the power unit 95 before the irradiation with flash light by the flash lamps FL. Then, while electric charge is accumulated on the capacitor 93, a pulse signal is output from the pulse generator 31 of the control unit 3 to the IGBT 96 so as to turn on and off drive of the IGBT 96.

The waveform of the pulse signal can be defined by inputting, from the input unit 33, a recipe in which time (ON time) of a pulse width and time (OFF time) of a pulse interval are sequentially set as parameters. When such a recipe is input to the control unit 3 by an operator through the input unit 33, the waveform setting unit 32 of the control unit 3 sets a pulse waveform that repeats on and off in accordance with the recipe. Then, the pulse generator 31 outputs a pulse signal in accordance with the pulse waveform set by the waveform setting unit 32. Accordingly, the pulse signal having the set waveform is applied to the gate of the IGBT 96 to control the turning on and off of drive of the IGBT 96. Specifically, the IGBT 96 becomes the ON state when the pulse signal input to the gate of the IGBT 96 is on, and the IGBT 96 becomes the OFF state when the pulse signal is off.

The control unit 3 applies high voltage (trigger voltage) to the trigger electrode 91 by controlling the trigger circuit 97 in synchronization with a timing at which the pulse signal output from the pulse generator 31 becomes on. When the pulse signal is input to the gate of the IGBT 96 while electric charge is accumulated on the capacitor 93, and high voltage is applied to the trigger electrode 91 in synchronization with the timing at which the pulse signal becomes on, current always flows between the end-part electrodes in the glass tube 92, and light is released through excitation of xenon atom or molecule when the pulse signal is on.

In this manner, the thirty flash lamps FL of the flash heating unit 5 emit light to irradiate the front surface of the semiconductor wafer W held by the holding unit 7 with flash light. When the flash lamps FL emit light without using the IGBT 96, however, electric charge accumulated on the capacitor 93 is consumed at one light emission, an output waveform from each flash lamp FL is a simple single pulse having a width of 0.1 millisecond to 10 milliseconds. In contrast, according to the present preferred embodiment, the IGBT 96 as a switching element is connected in a circuit, and a pulse signal is output to the gate of the IGBT 96 to turn on and off, through the IGBT 96, supply of electric charge from the capacitor 93 to the flash lamp FL, thereby turning on and off current flowing through the flash lamp FL. Accordingly, chopper control is performed on light emission of the flash lamp FL, so that electric charge accumulated on the capacitor 93 is consumed in a divided manner, and the flash lamp FL repeats flashing in an extremely short time. Since the next pulse is applied to the gate of the IGBT 96 and the value of current increases again before the value of current flowing through the circuit becomes completely zero, the light emission does not have completely zero output while the flash lamps FL repeats flashing.

A light emission pattern (time waveform of light emission output) of the flash lamp FL can be freely defined by controlling, through the IGBT 96, the turning on and off of current flowing through the flash lamp FL, and thus the time and intensity of light emission can be freely adjusted. The pattern of the turning on and off of drive of the IGBT 96 is defined by the time of the pulse width and the time of the pulse interval input from the input unit 33. Specifically, when the IGBT 96 is incorporated in the drive circuit of the flash lamp FL, the light emission pattern of the flash lamp FL can be freely defined only by setting the time of the pulse width and the time of the pulse interval input from the input unit 33 as appropriate.

Specifically, for example, when the ratio of the time of the pulse width relative to the time of the pulse interval input from the input unit 33 is increased, current flowing through the flash lamp FL is increased and thus the intensity of light emission is increased. In contrast, when the ratio of the time of the pulse width relative to the time of the pulse interval input from the input unit 33 is decreased, current flowing through the flash lamp FL is decreased and the intensity of light emission is decreased. The intensity of light emission of the flash lamp FL is constantly maintained by appropriately adjusting the ratio of the time of the pulse interval relative to the time of the pulse width input from the input unit 33. When the total time of a combination of the time of the pulse width and the time of the pulse interval input from the input unit 33 is increased, current continuously flows through the flash lamp FL for a relatively longer time and the flash lamp FL has a longer light emission time. The light emission time of the flash lamp FL is 1 second or less at maximum.

Figure 10:
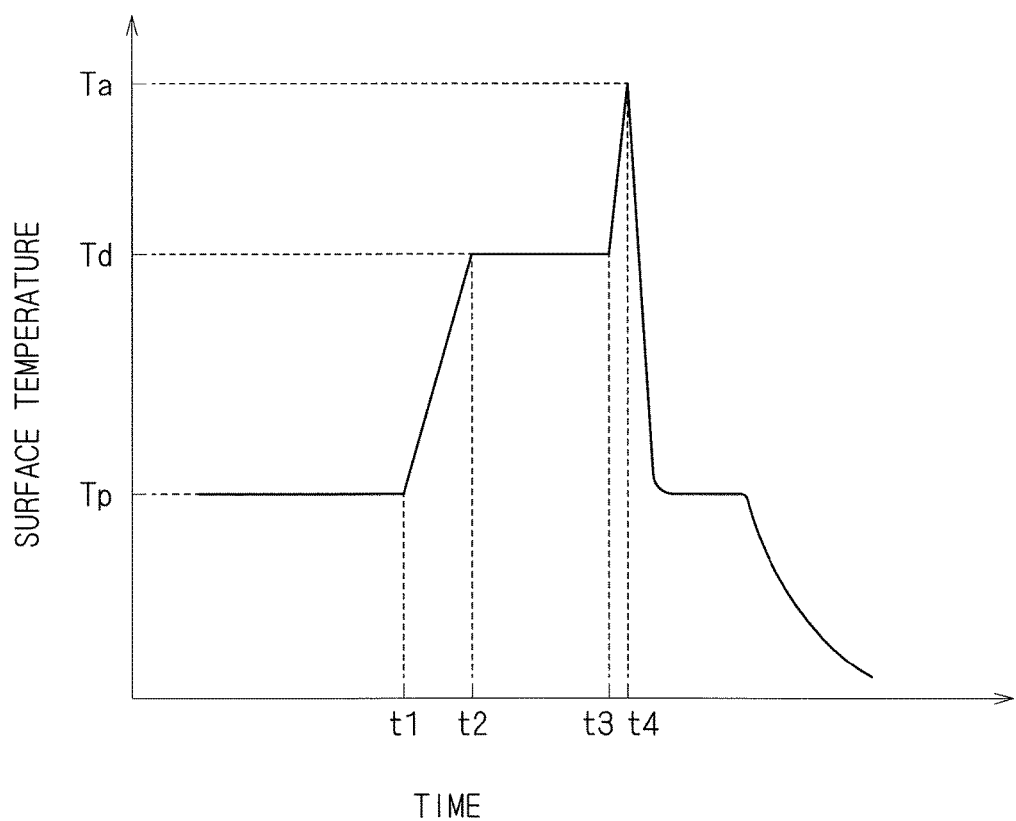
FIG. 10 is a diagram illustrating change in the surface temperature of a semiconductor wafer in a first preferred embodiment.

In this manner, the light emission pattern of the flash lamp FL is freely defined, thereby achieving adjustment of a temperature change pattern (time waveform of the surface temperature) of the surface of the semiconductor wafer W that receives flash light emitted from the flash lamp FL. FIG. 10 is a diagram illustrating change in the surface temperature of the semiconductor wafer W according to a first preferred embodiment. At time t1 when a predetermined time has elapsed after the temperature of the semiconductor wafer W reached the preheating temperature Tp, emission of flash light from the flash lamp FL is started. Right after the start of the emission of flash light, the ratio of the time of the pulse width relative to the time of the pulse interval is large and the intensity of light emission of the flash lamp FL is increased, so that the surface temperature of the semiconductor wafer W rapidly rises from the preheating temperature Tp.

At time t2 when the surface temperature of the semiconductor wafer W reaches a diffusion temperature Td, the ratio of the time of the pulse width relative to the time of the pulse interval decreases, the intensity of light emission of the flash lamp FL decreases, so that the surface temperature of the semiconductor wafer W is maintained at the diffusion temperature Td. The diffusion temperature Td is a temperature at which diffusion of the impurities introduced to the source-drain regions 105 occurs. When at least the surface of the semiconductor wafer W is made of silicon, the diffusion temperature Td ranges between 1100° C. and 1250° C. inclusive. No diffusion of the impurities occurs at the diffusion temperature Td lower than 1100° C., and the speed of the diffusion is too high at 1250° C. or higher.

The surface temperature of the semiconductor wafer W is maintained at the diffusion temperature Td from time t2 to time t3. A time during which the surface of the semiconductor wafer W is maintained at the diffusion temperature Td, which is an interval from time t2 to time t3, ranges from 1 millisecond to 10 millisecond inclusive. When the surface temperature of the semiconductor wafer W is maintained at the diffusion temperature Td for a time period not shorter than 1 millisecond and not longer than 10 milliseconds, the impurities introduced to the source-drain regions 105 diffuse inside the silicon substrate 101. Part of the impurities diffuses toward the region below the gate electrode 103 as indicated by arrow AR9 in FIG. 9.

At time t3, the ratio of the time of the pulse width relative to the time of the pulse interval increases again and the intensity of light emission of the flash lamp FL increases, so that the surface temperature of the semiconductor wafer W rapidly rises from the diffusion temperature Td to an activation temperature Ta. The activation temperature Ta is a temperature at which activation of the impurities introduced to the source-drain regions 105 occurs. The activation temperature Ta is higher than the diffusion temperature Td by 100° C. approximately (specifically, the activation temperature Ta ranges between 1200° C. and 1350° C. inclusive).

When the surface temperature of the semiconductor wafer W is risen to the activation temperature Ta, the impurities introduced to the source-drain regions 105 are activated. At time t4 when the surface temperature of the semiconductor wafer W reaches the activation temperature Ta, the IGBT 96 becomes the off state and the light emission of the flash lamp FL stops. Since the light emission of the halogen lamps HL is continued after the light emission of the flash lamp FL stops, the surface temperature of the semiconductor wafer W falls from the activation temperature Ta to the vicinity of the preheating temperature Tp.

After a predetermined time has elapsed since the light emission of the flash lamp FL stopped, the halogen lamps HL are turned off. Accordingly, the temperature of the semiconductor wafer W rapidly falls from the preheating temperature Tp. The temperature of the semiconductor wafer W during the fall is measured by the contact thermometer 130 or the radiation thermometer 120, and a result of the measurement is transmitted to the control unit 3. The control unit 3 monitors whether the temperature of the semiconductor wafer W falls to a predetermined temperature based on the result of the measurement. Then, after the temperature of the semiconductor wafer W falls below the predetermined temperature, the pair of transfer arms 11 of the transfer mechanism 10 are horizontally moved from the retracted position to the transfer operation position and risen again, so that the lift pins 12 stick out of the upper surface of the susceptor 74 to receive, from the susceptor 74, the semiconductor wafer W after the thermal processing. Subsequently, the transfer opening 66 closed by the gate valve 185 is opened, the semiconductor wafer W placed on the lift pins 12 is transferred out by the transfer robot outside of the apparatus, which completes the heating processing of the semiconductor wafer W in the thermal processing apparatus 1.

According to the first preferred embodiment, the IGBT 96 is incorporated in the drive circuit of the flash lamp FL, so that the light emission pattern of the flash lamp FL is freely defined to adjust the temperature change pattern of the surface of the semiconductor wafer W. Then, the surface temperature of the semiconductor wafer W is temporarily risen to the diffusion temperature Td from the preheating temperature Tp and is maintained at the diffusion temperature Td for a time period not shorter than 1 millisecond and not longer than 10 milliseconds, so that the impurities introduced to the source-drain regions 105 slightly diffuse toward the region below the gate electrode 103.

As described above, the overlapping length of the part in which impurities are diffused with the region below the gate electrode 103 is an important parameter that determines the performance of the semiconductor device. According to the present preferred embodiment, when the light emission pattern of the flash lamp FL is defined to allow free adjustment of the temperature change pattern of the surface of the semiconductor wafer W, the diffusion temperature Td and a time for which the surface temperature of the semiconductor wafer W is to be maintained at the diffusion temperature Td can be freely adjusted, thereby controlling the length of diffusion of the impurities introduced to the source-drain regions 105 toward the region below the gate electrode 103.

Subsequently, when the surface temperature of the semiconductor wafer W is risen from the diffusion temperature Td to the activation temperature Ta, the impurities introduced to the source-drain regions 105 are activated. Specifically, according to the first preferred embodiment, the activation of the impurities introduced to the source-drain regions 105 and the diffusion control of the impurities can be both performed. Accordingly, the performance of the semiconductor device can be highly enhanced.

The cap film 106 formed on the surfaces of the source-drain regions 105 to which impurities are introduced can prevent desorption of the impurities from the surfaces of the source-drain regions 105 during the heating processing of the semiconductor wafer W in the thermal processing apparatus 1, thereby preventing decrease in the concentration of the impurities.

Second Preferred Embodiment

The following describes a second preferred embodiment of the present invention. The thermal processing apparatus 1 according to the second preferred embodiment has a configuration completely same as that of the first preferred embodiment. In addition, the procedure of processing on the semiconductor wafer W in the thermal processing apparatus 1 according to the second preferred embodiment is substantially the same as that of the first preferred embodiment. The second preferred embodiment differs from the first preferred embodiment in the material of the surface of the semiconductor wafer W.

In the second preferred embodiment, germanium (Ge) is epitaxially grown on a silicon substrate, and the device structure as illustrated in FIG. 9 is formed on this germanium layer. In other words, the material of the surface of the semiconductor wafer W according to the second preferred embodiment is germanium, and impurities are introduced to the source-drain regions 105 of germanium. The cap film 106 is formed on the surfaces of the source-drain regions 105 to which the impurities are introduced.

Although the semiconductor wafer W has a germanium surface, the procedure of processing on the semiconductor wafer W in the thermal processing apparatus 1 is substantially the same as that of the first preferred embodiment. Specifically, after the preheating by the halogen lamps HL is performed, the surface temperature of the semiconductor wafer W is risen temporarily to the diffusion temperature Td from the preheating temperature Tp by irradiating the surface of the semiconductor wafer W with flash light from the flash lamps FL, and is maintained at the diffusion temperature Td for a time period not shorter than 1 millisecond and not longer than 10 milliseconds. Subsequently, the surface temperature of the semiconductor wafer W is risen from the diffusion temperature Td to the activation temperature Ta through the emission of flash light.

However, when the material of the surface of the semiconductor wafer W is germanium, the diffusion temperature Td ranges between 600° C. and 750° C. inclusive. This is because germanium has a melting point of 940° C. approximately, and additionally, the diffusion speed of impurities in germanium is high as compared to silicon. Specifically, when the surface temperature of the semiconductor wafer W is maintained at the diffusion temperature Td higher than 750° C., the impurities diffuse excessively. The impurities hardly diffuse at the diffusion temperature Td lower than 600° C.

When the material of the surface of the semiconductor wafer W is germanium, the activation temperature Ta ranges between 700° C. and 850° C. inclusive, which is higher than the diffusion temperature Td by 100° C. approximately. The temperature change pattern of the surface of the semiconductor wafer W is the same as that of the first preferred embodiment (FIG. 10).

In the second preferred embodiment, the light emission pattern of the flash lamp FL is freely defined to adjust the temperature change pattern of the surface of the semiconductor wafer W. Then, the surface temperature of the semiconductor wafer W is risen temporarily to the diffusion temperature Td from the preheating temperature Tp, and is maintained at the diffusion temperature Td for a time period not shorter than 1 millisecond and not longer than 10 milliseconds, so that the impurities introduced to the source-drain regions 105 slightly diffuse toward the region below the gate electrode 103. When the light emission pattern of the flash lamp FL is defined to allow free adjustment of the temperature change pattern of the surface of the semiconductor wafer W, the diffusion temperature Td and a time for which the surface temperature of the semiconductor wafer W is to be maintained at the diffusion temperature Td can be freely adjusted, thereby controlling the length of diffusion of the impurities introduced to the source-drain regions 105 toward the region below the gate electrode 103.

Subsequently, when the surface temperature of the semiconductor wafer W is risen from the diffusion temperature Td to the activation temperature Ta, the impurities introduced to the source-drain regions 105 are activated. Specifically, according to the second preferred embodiment, the activation of the impurities introduced to the source-drain regions 105 and the diffusion control of the impurities can also be both performed.

In particular, when N-type dopants of, for example, arsenic (As) or phosphorus (P) are introduced as impurities into germanium, the impurities have a high diffusion speed but a low activation rate. Thus, as disclosed in Japanese Patent Laid-Open No. 2013-201453, when the surface temperature of the semiconductor wafer W is maintained at a target temperature for 10 milliseconds approximately, the introduced impurities diffuse excessively. On the other hand, the impurities are not activated when the surface temperature of the semiconductor wafer W is maintained at a temperature suitable for diffusion. According to the technology of the present invention, after the surface temperature of the semiconductor wafer W is risen temporarily to the diffusion temperature Td and is maintained at the diffusion temperature Td for a time period not shorter than 1 millisecond and not longer than 10 milliseconds, the surface temperature is risen to the activation temperature Ta. In this manner, even when N-type dopants are introduced as impurities in germanium the activation of the impurities and the diffusion control of the impurities can be both performed. Thus, the technology of the present invention is particularly preferable for a configuration in which N-type dopants are introduced as impurities into the semiconductor wafer W having a germanium surface.

The N-type dopants in germanium have high vapor pressure, and thus are likely to desorb from the surface of the germanium layer during the heating processing, the cap film 106 formed on the surfaces of the source-drain regions 105 to which the impurities are introduced can prevent decrease in the concentration of the impurities due to the desorption of the impurities.

Third Preferred Embodiment

The following describes a third preferred embodiment of the present invention. The thermal processing apparatus 1 according to the third preferred embodiment has a configuration completely same as that of the first preferred embodiment. In addition, the procedure of processing on the semiconductor wafer W in the thermal processing apparatus 1 according to the third preferred embodiment is substantially the same as that of the first preferred embodiment. The third preferred embodiment differs from the first preferred embodiment in the temperature change pattern of the surface of the semiconductor wafer W through the emission of flash light.

FIG. 11 is a diagram illustrating change in the surface temperature of the semiconductor wafer W according to the third preferred embodiment. According to the third preferred embodiment, the IGBT 96 is incorporated in the drive circuit of the flash lamp FL, so that the light emission pattern of the flash lamp FL is also freely defined to adjust the temperature change pattern of the surface of the semiconductor wafer W.

Similarly to the first preferred embodiment, at time t1 when a predetermined time has elapsed after the temperature of the semiconductor wafer W reached the preheating temperature Tp, the emission of flash light from the flash lamp FL is started. At time t2 when the surface temperature of the semiconductor wafer W reaches the diffusion temperature Td, the intensity of the light emission of the flash lamp FL is decreased and the surface temperature of the semiconductor wafer W is maintained at the diffusion temperature Td until time t3.

In the third preferred embodiment, at time t3, the ratio of the time of the pulse width relative to the time of the pulse interval is further reduced to decrease the intensity of the light emission of the flash lamp FL so that the surface temperature of the semiconductor wafer W falls below the diffusion temperature Td. Then, at time t5, the ratio of the time of the pulse width relative to the time of the pulse interval increases again and the intensity of the light emission of the flash lamp FL increases, so that the surface temperature of the semiconductor wafer W is rapidly risen to the activation temperature Ta. At time t4 when the surface temperature of the semiconductor wafer W reaches the activation temperature Ta, the IGBT 96 becomes the off state and the light emission of the flash lamp FL stops. Remaining matters of the third preferred embodiment other than the temperature change pattern of the surface of the semiconductor wafer W through the emission of flash light are the same as those of the first preferred embodiment.

According to the third preferred embodiment, after the surface temperature of the semiconductor wafer W is risen from the preheating temperature Tp to the diffusion temperature Td and is maintained at the diffusion temperature Td for a time period not shorter than 1 millisecond and not longer than 10 milliseconds, the surface temperature is risen to the activation temperature Ta. In this manner, similarly to the first preferred embodiment, the activation of the impurities introduced to the source-drain regions 105 and the diffusion control of the impurities can be both performed.

In the third preferred embodiment, the surface temperature of the semiconductor wafer W temporarily falls after being maintained at the diffusion temperature Td so as to dissipate heat accumulated in the semiconductor wafer W when maintained at the diffusion temperature Td from time t2 to time t3. Thereafter, the surface temperature of the semiconductor wafer W is risen to the activation temperature Ta, and thus the surface temperature of the semiconductor wafer W can fall fast after the activation processing, thereby preventing any excessive diffusion of the impurities.

Fourth Preferred Embodiment

The following describes a fourth preferred embodiment of the present invention. The thermal processing apparatus 1 according to the fourth preferred embodiment has a configuration completely same as that of the first preferred embodiment. In addition, the procedure of processing on the semiconductor wafer W in the thermal processing apparatus 1 according to the fourth preferred embodiment is substantially the same as that of the first preferred embodiment. The fourth preferred embodiment differs from the first preferred embodiment in the temperature change pattern of the surface of the semiconductor wafer W through the emission of flash light.

FIG. 12 is a diagram illustrating change in the surface temperature of the semiconductor wafer W according to the fourth preferred embodiment. According to the fourth preferred embodiment, the IGBT 96 is incorporated in the drive circuit of the flash lamp FL, so that the light emission pattern of the flash lamp FL is also freely defined to adjust the temperature change pattern of the surface of the semiconductor wafer W.

As illustrated in FIG. 12, in the fourth preferred embodiment, the temperature change pattern same as that of the first preferred embodiment is repeated twice. Specifically, such a temperature change pattern is repeated twice that after the surface temperature of the semiconductor wafer W is risen temporarily to the diffusion temperature Td from the preheating temperature Tp and is maintained at the diffusion temperature Td for a time period not shorter than 1 millisecond and not longer than 10 milliseconds, the surface temperature is risen to the activation temperature Ta.

According to the fourth preferred embodiment, the surface temperature is risen to the activation temperature Ta after the surface temperature of the semiconductor wafer W is maintained at the diffusion temperature Td, and thus, similarly to the first preferred embodiment, the activation of the impurities introduced to the source-drain regions 105 and the diffusion control of the impurities can be both performed.

<Modification>

The above describes the preferred embodiments of the present invention, but various kinds of modifications of the present invention other than those described above can be performed without departing from the scope of the present invention. For example, in the second preferred embodiment, the semiconductor wafer W obtained by epitaxially growing germanium on a silicon substrate is used, but the substrate itself may be the semiconductor wafer W made of germanium. In other words, at least the material of the surface of the semiconductor wafer W may be germanium. The technology of the present invention is particularly preferable for the above-described case in which N-type dopants such as arsenic or phosphorus are introduced, as impurities, into the semiconductor wafer W having a germanium surface.

In the third and fourth preferred embodiments, the semiconductor wafer W to be processed may have a surface made of silicon or germanium.

Figure 13:
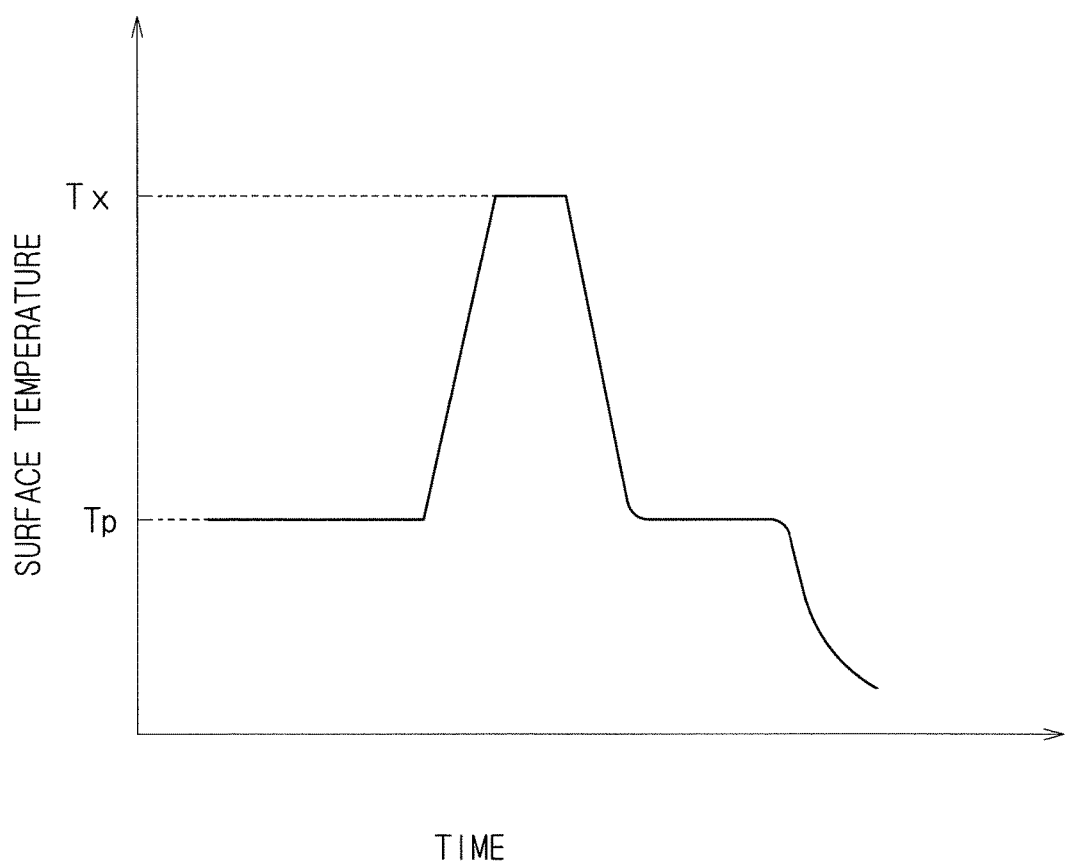
FIG. 13 is a diagram illustrating another example of change in the surface temperature of a semiconductor wafer.

When at least the material of the surface of the semiconductor wafer W is germanium, the surface temperature of the semiconductor wafer W may have a change pattern as illustrated in FIG. 13. In the temperature change pattern illustrated in FIG. 13, the surface temperature of the semiconductor wafer W is risen from the preheating temperature Tp to a processing temperature Tx and is maintained at the processing temperature Tx for a predetermined time. The processing temperature Tx is higher (for example, 800° C.) than the diffusion temperature Td (between 600° C. and 750° C. inclusive) for the semiconductor wafer W having a germanium surface according to the second preferred embodiment. When N-type dopants are introduced as impurities into germanium on the surface and the surface temperature of the semiconductor wafer W is heated to 800° C., the impurities have a markedly high diffusion speed. For this reason, in the temperature change pattern illustrated in FIG. 13, a time for which the surface temperature of the semiconductor wafer W is maintained at the processing temperature Tx is finely controlled in units of 0.1 millisecond. When the IGBT 96 is used to control the light emission of the flash lamp FL, such a fine control in units of 0.1 millisecond can be easily achieved.

When, the time for which the surface temperature of the semiconductor wafer W is maintained at the processing temperature Tx is finely controlled in units of 0.1 millisecond, the length of diffusion of the impurities introduced to the source-drain regions 105 toward the region below the gate electrode 103 can be controlled even with a high diffusion speed of the impurities. When the surface temperature of the semiconductor wafer W is risen to the processing temperature Tx higher than the diffusion temperature Td according to the second preferred embodiment, the activation of the impurities can be performed too. Accordingly, even with the temperature change pattern as illustrated in FIG. 13, the activation of the impurities introduced to the source-drain regions 105 and the diffusion control of the impurities can be both performed.

Although the thirty flash lamps FL are provided to the flash heating unit 5 in each of the above-described preferred embodiments, the present invention is not limited thereto, and an optional number of the flash lamps FL may be provided. Each flash lamp FL is not limited to a xenon flash lamp, but may be a krypton flash lamp. The number of the halogen lamps HL provided to the halogen heating unit 4 is not limited to forty but may be optional.

Although preheating of the semiconductor wafer W is performed by halogen light irradiation from the halogen lamps HL in each of the above-described preferred embodiments, a method of the preheating is not limited thereto. The semiconductor wafer W may be preheated by being placed on a hot plate.

While the invention has been shown and described in detail, the foregoing description is in all aspects illustrative and not restrictive. It is therefore understood that numerous modifications and variations can be devised without departing from the scope of the invention.

What is claimed is:

1. A thermal processing method of heating a substrate into which impurities are introduced in a source-drain region, by irradiating said substrate with light, the method comprising the steps of:
    (a) irradiating said substrate with light from a continuously lighting lamp to raise a temperature of said substrate to a preheating temperature;
    (b) irradiating said substrate with flash light from a flash lamp after said step (a) to raise the surface temperature of said substrate from said preheating temperature to a diffusion temperature at which diffusion of said impurities occurs in said source-drain region, subsequently decreasing the intensity of light emission of said flash lamp to maintain the surface temperature of said substrate at said diffusion temperature for not shorter than 1 millisecond and not longer than 10 milliseconds, in a manner that controls a length of diffusion of said impurities, and
    (c) after said step (b), irradiating said substrate with flash light from said flash lamp to raise the surface temperature of said substrate from said diffusion temperature to an activation temperature at which activation of said impurities occurs, in a manner that does not allow the surface temperature to fall below said diffusion temperature between said step (b) and said step (c).

2. The thermal processing method according to claim 1, wherein said step (b) and said step (c) are repeated a plurality of times.

3. The thermal processing method according to claim 1, wherein a cap film is formed on a region in which said impurities are introduced on a surface of said substrate.

4. The thermal processing method according to claim 1, wherein
    at least a material of a surface of said substrate is germanium, and
    said diffusion temperature ranges between 600° C. and 750° C. inclusive.

5. The thermal processing method according to claim 1, wherein
    at least a material of a surface of said substrate is silicon, and
    said diffusion temperature ranges between 1100° C. and 1250° C. inclusive.

* * * * *